United States Patent
Le et al.

(10) Patent No.: US 6,597,222 B2
(45) Date of Patent: Jul. 22, 2003

(54) POWER DOWN CIRCUIT FOR HIGH OUTPUT IMPEDANCE STATE OF I/O DRIVER

(75) Inventors: Loi Thanh Le, San Jose, CA (US); Pekka Ojala, Fremont, CA (US); Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/978,255

(22) Filed: Oct. 15, 2001

(65) Prior Publication Data

US 2003/0071660 A1 Apr. 17, 2003

(51) Int. Cl.$^7$ .................................................. H03K 3/02
(52) U.S. Cl. ........................ 327/198; 327/143; 327/537; 326/58; 326/81
(58) Field of Search .................... 327/108–112, 530, 327/534, 537, 142–143, 198, 382, 387, 333; 326/22–24, 26, 27, 30, 33, 34, 62, 82, 83, 85–88, 58, 81; 307/412; 365/189.05, 230.08, 185.18, 185.27

(56) References Cited

U.S. PATENT DOCUMENTS

| | | | | |
|---|---|---|---|---|
| 5,450,025 A | * | 9/1995 | Shay | 326/81 |
| 5,661,414 A | * | 8/1997 | Shigehara et al. | 326/27 |
| 5,867,039 A | * | 2/1999 | Golke | 326/81 |
| 6,351,158 B1 | * | 2/2002 | Shearon et al. | 326/22 |

* cited by examiner

*Primary Examiner*—Minh Nguyen
(74) *Attorney, Agent, or Firm*—Townsend and Townsend and Crew LLP

(57) ABSTRACT

A circuit for putting an output driver into a high impedance state upon failure of the power supply. This is accomplished by providing a first transistor that is connected between the power supply and the n-well to charge the n-well node of the PMOS drive transistor. Upon failure of the supply voltage, a number of transistors are connected to couple the n-well and a gate of the PMOS drive transistor to the output line, so that they track the voltage level of the output, thereby preventing forward biasing of the P+/n-well diode.

6 Claims, 2 Drawing Sheets

POWER DOWN CIRCUIT FOR HIGH OUTPUT IMPEDANCE STATE OF I/O DRIVER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to output drivers, and in particular to multiple output drivers connected together in a telecommunication system when power to one output driver is down.

FIG. 1 illustrates output drivers (input/output drivers) in a first semiconductor chip 12 and second semiconductor chip 14. Alternately, the drivers can be on the same chip using different VDDs. Chip 12 includes a PMOS transistor 16 and an NMOS transistor 18 connected to an output line 20. PMOS transistor 16 is connected to the positive output (INP1) of a signal while NMOS transistor 18 is connected to a negative output (INN1).

Similarly, chip 14 includes a PMOS transistor 22 and an NMOS transistor 24 for driving output line 26. In one configuration, output lines 20 and 26 are connected together to provide a common output line 28.

A problem of signal amplitude deterioration arises when the power supply of either output driver fails and is off. In such a situation, when chip 14 drives output line 28 to a high state, a high voltage is also applied to output line 20 of chip 12. This will forward bias the P+/n-well diode of PMOS transistor 16 if the power supply VD1 is low. This affects the signal amplitude that chip 14 can drive to output line 28.

BRIEF SUMMARY OF THE INVENTION

The present invention provides a circuit for putting an output driver into a high impedance state upon failure of the power supply. This is accomplished by providing a first transistor that is connected between the power supply and the n-well to charge the n-well potential of all the PMOS devices up to VDD. Upon failure of the supply voltage, a number of transistors are connected to couple the charged-up n-well and a gate of the PMOS drive transistor to the output line, so that they track the voltage level of the output, thereby preventing forward biasing of the P+/n-well diode.

In one embodiment, the transistors include a transistor for connecting the n-well to the output line, the transistor being activated by a low power supply voltage. A switch (NMOS) transistor is provided to isolate the gate of the PMOS drive transistor from its input signal upon a low power supply. An additional two (PMOS) transistors, both activated by a low power supply, are used to couple the gates of the PMOS drive transistor and the transfer gate transistor to the output line, so that they track the voltage levels of the output line.

For a further understanding of the nature and advantages of the invention, reference should be made to the following description taken in conjunction with the accompanying drawings.

DETAILED DESCRIPTION OF THE INVENTION

Figure 1:
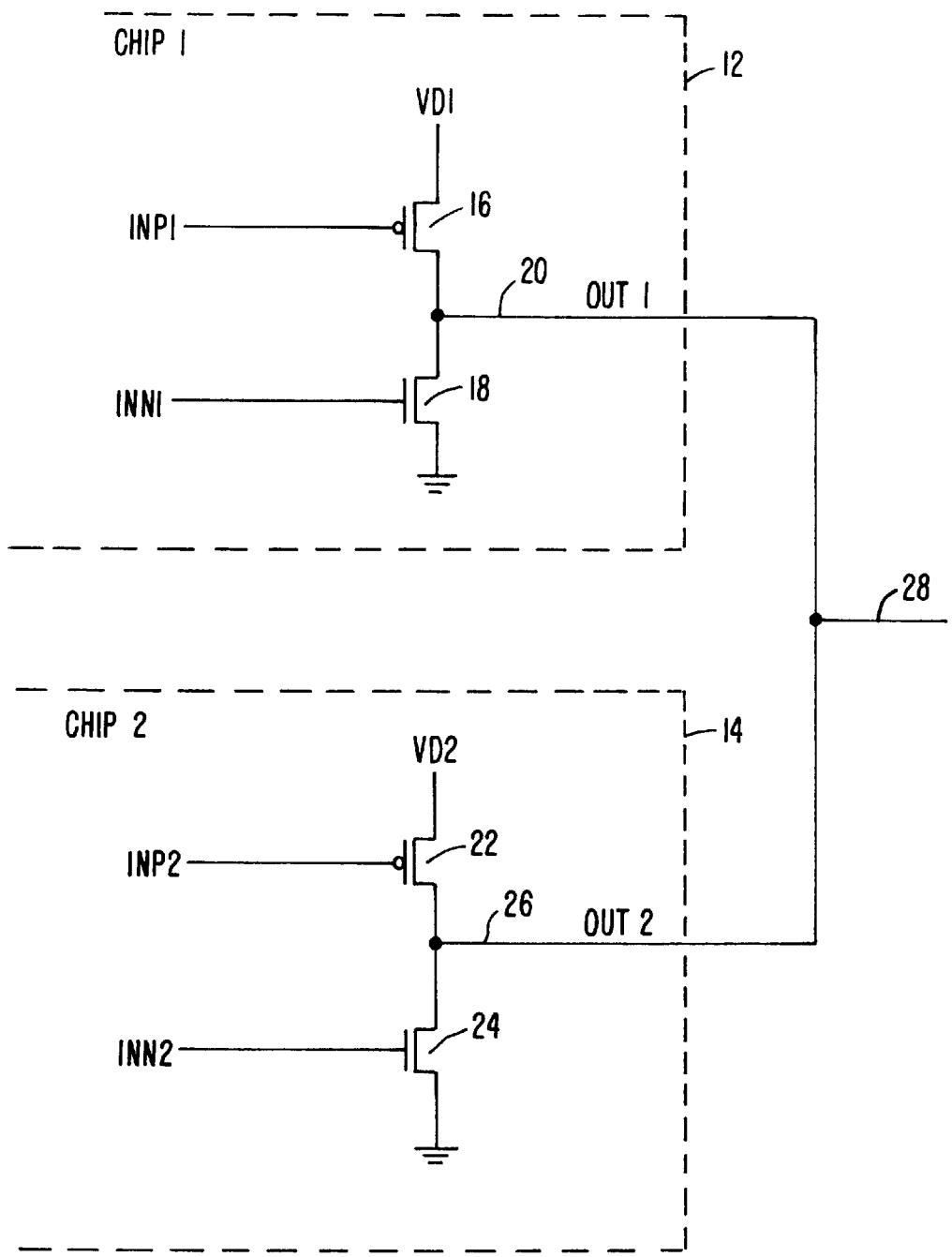
FIG. 1 is a circuit diagram illustrating two prior art output drivers connected together.
Figure 2:
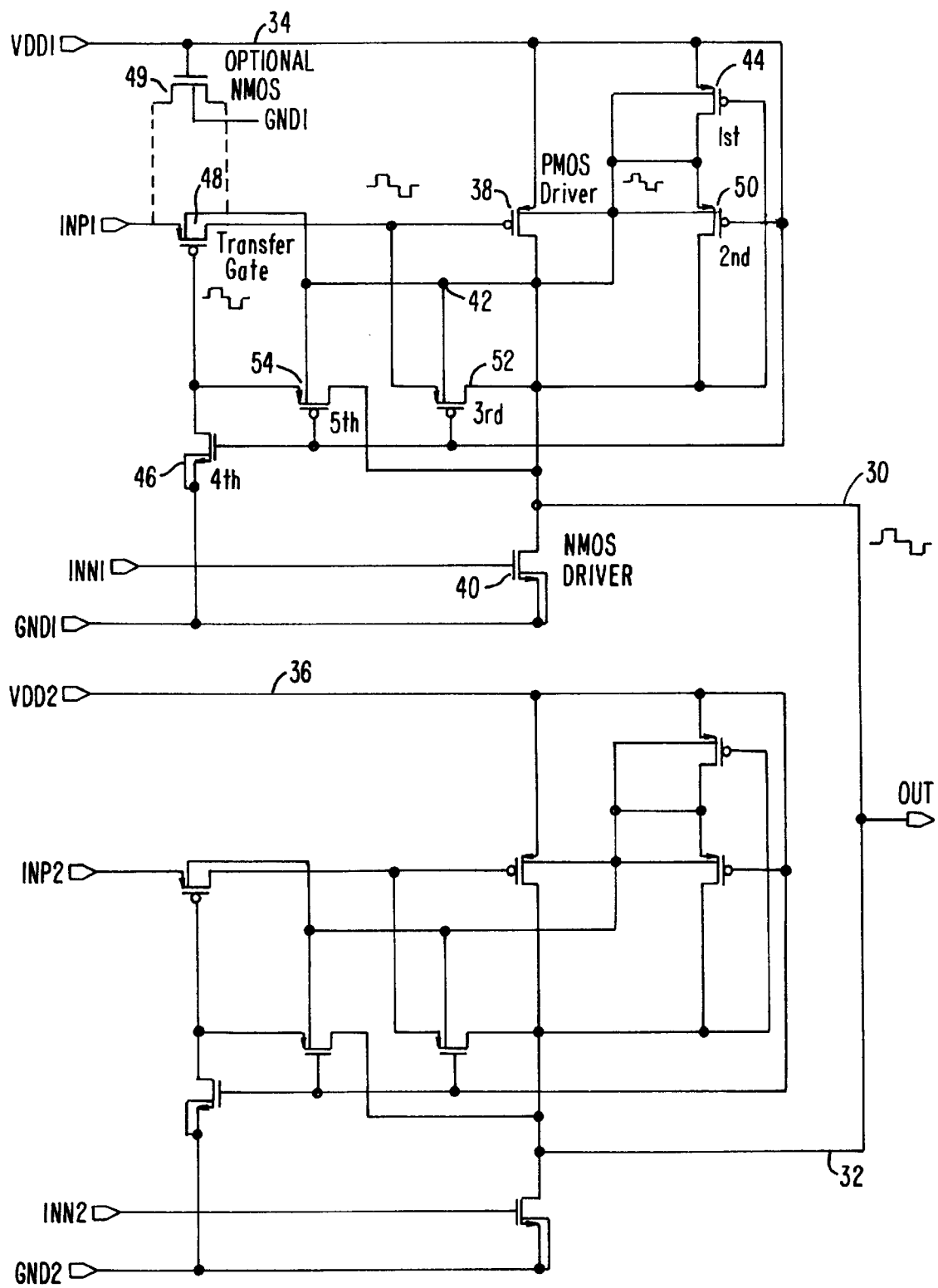
FIG. 2 is a circuit diagram of an embodiment of the present invention.

FIG. 2 illustrates one embodiment of a circuit according to the present invention. The transistors are described both with reference numbers and the terms used in the appended claims (which are circled for ease of reference). Two I/O drivers are shown, a first having an output connected to an output line OUT1 on line 30, and second connected to output line OUT 2 on line 32. These two output lines are connected together. The two I/O drivers have separate power supplies, the first having a power supply VDD1 on line 34 and the second having a power supply VDD2 on line 36.

The first I/O driver has a PMOS drive transistor 38 and an NMOS drive transistor 40. These two transistors are connected to complementary input signals INP1 and INN1, respectively. In the event of a power supply failure on VDD1 on line 34, a high level output driven on output line 30 would forward bias a P+/n-well diode of PMOS drive transistor 38, causing current to flow into n-well 42.

The present invention provides a first transistor 44, which is a PMOS transistor having its gate connected to output line 30. When the output line is low, this transistor turns on, causing a voltage from VDD1 to charge a parasitic capacitance coupled to n-well 42. This occurs during normal operation of the circuit. Also during normal operation, a transistor 46 (fourth transistor) has its gate pulled high by VDD1, thereby pulling low the gate of a transfer gate transistor 48, turning on the transfer gate transistor and allowing signals to pass from INP1 to the gate of PMOS drive transistor 38. Optionally, an NMOS gate transistor 49 could be connected in parallel.

Upon a failure of VDD1, it will go close to zero, turning off transistor 46, allowing the node at the gate of transfer gate transistor 48 to float. This low value of VDD1 will turn on PMOS transistors 50 (second transistor), 52 (third) and 54 (fifth). Transistor 50, when activated by a low voltage on the power supply, connects output line 30 to the n-well 42. Transistor 52 connects the output line 30 to the gate of PMOS drive transistor 38. Thus, the n-well and the gate of output drive transistor 38 will track the high and low voltage levels provided to output line 30 by the other connected drive transistors (on line 32). In addition, transistor 50 is also connected between output line 30 and the gate of transfer gate transistor 48, causing the transfer gate transistor to have the voltage at its gate match the voltage at its drain, connected to the gate of PMOS transistor 38. This prevents forward biasing drain and source and loss of current through the transfer gate transistor 48. A three-state output signal is illustrated at output line 30, and is also shown to be provided to N-well 42, the gate of PMOS transistor 38, and the gate of transistor 48 to maintain these nodes at the same voltage level. This prevents forward biasing of drain and source diodes that would drain current when the output line is driven by another I/O driver circuit.

In a preferred embodiment, VDD1 is three volts. During normal operation, the inputs INP1 and INN1 turn on and off drive transistors 38 and 40, with one being on while the other is off and vice versa. The output is then swung between low level e.g. zero (actually 0.3 volts here) and high level e.g. three volts (actually 2.7 volts here), turning on and off transistor 44. When transistor 44 is on, it gradually charges the n-well node 42 (a reversed bias PN-junction of n-well to p-substrate) to three volts. When transistor 44 is off, the n-well will hold its charge at three volts. With the n-well at three volts, there is no latch up in the PMOS devices. Latch-up condition in a CMOS circuit refers to a situation wherein VDD is shorted to VSS via forward biased junctions, resulting in a destructive high-current short. This must be avoided at all cost. During normal operation, transistors 50, 52 and 54 are off because their gates are connected to VDD1.

During the loss of power or power down, VDD1 is zero volts. The voltages at the n-well node 42 and the gates of transistors 38 and 40 are almost equal, as described above. (The difference is less than 0.4 volts.) These voltages are insufficient to turn on the PN-junctions of drain and source in transistors 38 and 48.

As would be understood by those of skill in the art, the present invention may be embodied in other specific forms without departing from the essential characteristics thereof. For example, different specific transistor arrangements could be used to tie the n-well and gate of the PMOS driver to the output line. Accordingly, the foregoing description is intended to be illustrative, but not limiting, of the scope of the invention which is set forth in the following claims.

What is claimed is:

1. In an output driver circuit having a PMOS drive transistor and an NMOS drive transistor connected to an output line, a circuit for limiting conduction to an n-well of said PMOS drive transistor in the event of a power supply failure while said output line is connected to another circuit driving said output line, said circuit comprising:
    a first transistor connected between said power supply and said n-well to charge a parasitic capacitance of said PMOS drive transistor;
    a plurality of transistors connected to couple said n-well and a gate of said PMOS drive transistor to a voltage level of said output line, including:
        a first circuit for disconnecting a signal line input to said PMOS drive transistor;
        a second circuit coupled to the output line for controlling the signal line input to the gate of said PMOS drive transistor;
    wherein said plurality of transistors further includes:
        a second PMOS transistor having a gate connected to said power supply, a source connected to said n-well and a drain connected to said output line;
        a third PMOS transistor having a gate connected to said power supply, a source connected to said gate of said PMOS drive transistor, and a drain connected to said output line;
    wherein said first circuit comprises:
        a transfer gate transistor connected between the gate of said PMOS drive transistor and said signal line input for said PMOS drive transistor; and
        a fourth transistor (NMOS), connected to a gate of said transfer gate transistor and having a gate connected to said power supply, for turning off said transfer gate transistor upon a failure of said power supply.

2. The output driver of claim 1 wherein said second circuit comprises:
    a fifth transistor having a gate coupled to said power supply, a source connected to said gate of said transfer gate transistor, and a drain connected to said output line, for connecting said gate of said transfer gate transistor to said output line upon a failure of said power supply.

3. In an output driver circuit having a PMOS drive transistor and NMOS drive transistor connected to an output line, a circuit for limiting conduction to an n-well of said PMOS drive transistor in the event of a power supply failure while said output line is connected to another circuit driving said output line, said circuit comprising:
    a first transistor connected between said power supply and said n-well to charge an n-well node of said PMOS drive transistor;
    a second PMOS transistor having a gate connected to said power supply, a source connected to said n-well and a drain connected to said output line;
    a third PMOS transistor having a gate connected to said power supply, a source connected to a gate of said PMOS drive transistor, and a drain connected to said output line;
    a buffer transistor connected between the gate of said PMOS drive transistor and a signal input line for said PMOS drive transistor;
    a fourth transistor, connected to a gate of said buffer transistor and having a gate connected to said power supply, for turning off said buffer transistor upon a failure of said power supply;
    a fifth transistor having a gate coupled to said power supply, a source connected to said gate of said buffer transistor, and a drain connected to said output line, for connecting said gate of said buffer transistor to said output line upon a failure of said power supply; and
    wherein said first, second, third and fifth transistors all share said n-well.

4. The output driver of claim 3 further comprising a second output line from a second output driver connected to said output line.

5. In an output driver circuit having a PMOS drive transistor and an NMOS drive transistor connected to an output line, a circuit for limiting conduction to an n-well of said PMOS drive transistor in the event of a power supply failure while said output line is connected to another circuit driving said output line, said circuit comprising:
    a first transistor connected between said power supply and said n-well to charge a parasitic capacitance of said PMOS drive transistor; and
    a plurality of transistors connected to couple said n-well and a gate of said PMOS drive transistor to a voltage level of said output line, wherein said plurality of transistor includes:
        a second PMOS transistor having a gate connected to said power supply, a source connected to said n-well and a drain connected to said output line;
        a third PMOS transistor having a gate connected to said power supply, a source connected to said gate of said PMOS drive transistor, and a drain connected to said output line;
        a transfer gate transistor connected between said gate of said PMOS drive transistor and a signal input line for said PMOS drive transistor;
        a fourth transistor (NMOS), connected to a gate of said transfer gate transistor and having a gate connected to said power supply, for turning off said transfer gate transistor upon a failure of said power supply; and a fifth transistor having a gate coupled to said power supply, a source connected to said gate of said transfer gate transistor, and a drain connected to said output line, for connecting said gate of said transfer gate transistor to said output line upon a failure of said power supply.

6. In an output driver circuit having a PMOS drive transistor and an NMOS drive transistor connected to an output line, a circuit for limiting conduction to an n-well of said PMOS drive transistor in the event of a power supply failure while said output line is connected to another circuit driving said output line, said circuit comprising:

a first transistor connected between said power supply and said n-well to charge a parasitic capacitance of said PMOS drive transistor;

a plurality of transistors connected to couple said n-well and a gate of said PMOS drive transistor to a voltage level of said output line, including:

a first circuit for disconnecting a signal line input to said PMOS drive transistor;

a second circuit coupled to the output line for controlling the signal line input to the gate of said PMOS drive transistor;

wherein said first circuit includes a transfer gate transistor connected between said gate of said PMOS drive transistor and the signal line input for said PMOS drive transistor; and an NMOS transistor coupled across said transfer gate transistor.

* * * * *